(12) United States Patent
Popp et al.

(10) Patent No.: US 10,454,057 B2
(45) Date of Patent: Oct. 22, 2019

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Michael Popp, Freising (DE); Philipp Schwamb, Regensburg (DE); Richard Baisl, Regensburg (DE); Johannes Rosenberger, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/552,812

(22) PCT Filed: Feb. 22, 2016

(86) PCT No.: PCT/EP2016/053666
§ 371 (c)(1),
(2) Date: Aug. 23, 2017

(87) PCT Pub. No.: WO2016/135094
PCT Pub. Date: Sep. 1, 2016

(65) Prior Publication Data
US 2018/0047932 A1    Feb. 15, 2018

(30) Foreign Application Priority Data
Feb. 23, 2015 (DE) .................. 10 2015 102 520

(51) Int. Cl.
*H01L 51/52* (2006.01)
*H01L 33/50* (2010.01)
(Continued)

(52) U.S. Cl.
CPC ........ *H01L 51/5203* (2013.01); *H01L 33/505* (2013.01); *H01L 33/60* (2013.01);
(Continued)

(58) Field of Classification Search
CPC . H01L 2924/00014; H01L 2224/45015; H01L 33/62; H01L 2924/00;
(Continued)

(56) References Cited

U.S. PATENT DOCUMENTS

| 2011/0132645 | A1  | 6/2011 | Shi et al. |
| 2012/0132930 | A1* | 5/2012 | Young ................. H01L 31/0481 257/84 |
| 2013/0154789 | A1  | 6/2013 | Maher et al. |

FOREIGN PATENT DOCUMENTS

| DE | 102012109141 A1 | 3/2014 |
| DE | 102012223159 A1 | 6/2014 |

(Continued)

OTHER PUBLICATIONS

NPL WO2014048917 [Machine's Translation].*
(Continued)

*Primary Examiner* — Tony Tran
(74) *Attorney, Agent, or Firm* — Viering, Jentschura & Partner mbB

(57) ABSTRACT

An optoelectronic component is provided with a carrier; a zinc oxide layer arranged on the carrier and having the first and second regions, wherein the first region is a first electrode structure which is doped with aluminum so that the first region is transparent and electrically conductive; an organic optically functional layer structure arranged at least partially over the first electrode structure; and a second electrode structure arranged at least partially over the organic optically functional layer structure. The first and second electrode structures electrically contact the organic optically functional layer structure. The zinc oxide layer has a lower doping in the second region than the first electrode structure. The zinc oxide layer is configured in the second region as a varistor layer structure, which is arranged between the first and second electrode structures and contacts the two electrode structures. The varistor layer structure adjoins the optically transparent first region.

4 Claims, 7 Drawing Sheets

(51) Int. Cl.
   *H01L 33/60* (2010.01)
   *H01L 51/44* (2006.01)
   *H01L 51/56* (2006.01)
(52) U.S. Cl.
   CPC ........ *H01L 51/448* (2013.01); *H01L 51/5237* (2013.01); *H01L 51/56* (2013.01); *H01L 2251/301* (2013.01); *H01L 2924/12044* (2013.01); *H01L 2933/0016* (2013.01); *H01L 2933/0041* (2013.01)
(58) Field of Classification Search
   CPC ... H01L 33/486; H01L 51/56; H01L 51/5253; H01L 2251/5361; H01L 51/5203
   See application file for complete search history.

(56) References Cited

FOREIGN PATENT DOCUMENTS

| | | |
|---|---|---|
| WO | 2007062171 A2 | 5/2007 |
| WO | 2011007297 A2 | 1/2011 |
| WO | 2014048917 A1 | 4/2014 |
| WO | 2014090626 A2 | 6/2014 |

OTHER PUBLICATIONS

German Search Report based on application No. 10 2015 102 520.5 (10 pages) dated Dec. 21, 2015 (Reference Purpose Only).
International Search Report based on application No. PCT/EP2016/053666 (6 pages and 3 pages of English translation) dated Jun. 13, 2016 (Reference Purpose Only).

\* cited by examiner

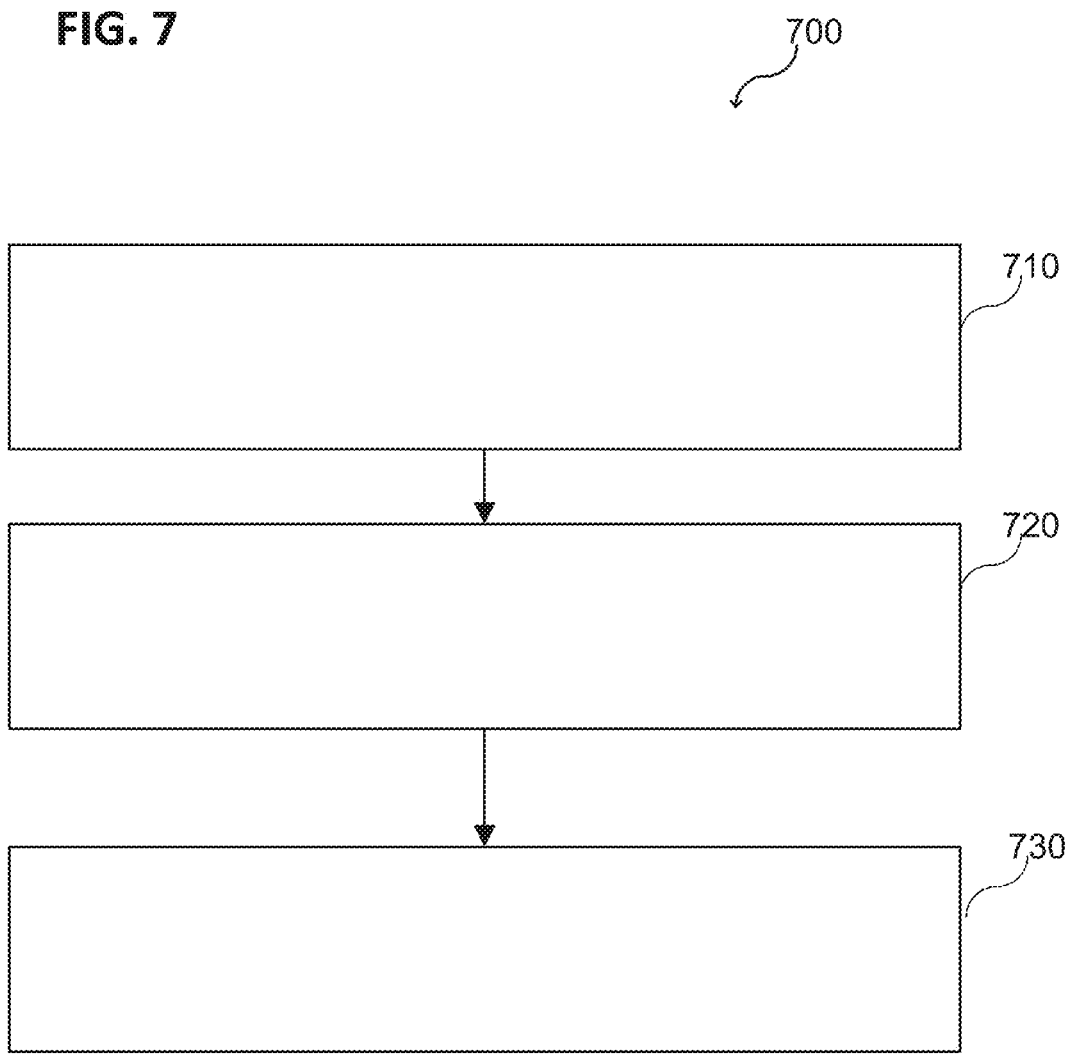

OPTOELECTRONIC COMPONENT AND METHOD FOR PRODUCING AN OPTOELECTRONIC COMPONENT

RELATED APPLICATIONS

The present application is a national stage entry according to 35 U.S.C. § 371 of PCT application No.: PCT/EP2016/053666 filed on Feb. 22, 2016, which claims priority from German application No.: 10 2015 102 520.5 filed on Feb. 23, 2015, and is incorporated herein by reference in its entirety.

TECHNICAL FIELD

The present disclosure relates to an optoelectronic component and to a method for producing an optoelectronic component.

BACKGROUND

In general, optoelectronic components may be used for a wide range of applications in which generation of light is necessary. For example, optoelectronic components are used to display information (for example in displays, in advertising panels or in mobile telephony devices) and/or to illuminate objects or rooms, for example in the form of planar illumination modules. Such optoelectronic components may be based on the principle of electroluminescence, which makes it possible to convert electrical energy with a high efficiency into light. For example, these optoelectronic components may include one or more optically functional layers, for example in the form of organic light-emitting diodes (OLEDs) or inorganic light-emitting diodes (LEDs), which make it possible to generate and emit colored light in the form of patterns and/or with a particular color stimulus.

SUMMARY

According to various embodiments, an optoelectronic component is provided which has only a low susceptibility to electrostatic discharges (so-called ESD) or voltage spikes. The voltage spikes may, for example, be coupled from a driver circuit for operating the optoelectronic component into the optoelectronic component, for example when switching on and/or switching off the optoelectronic component, or the driver circuit. For example, optoelectronic components whose functional principle is based on an organic optically functional layer structure conventionally have a high sensitivity to electrostatic discharge or voltage spikes, which can lead to irreversible damage in the organic optically functional layer structure. For example, an organic optically functional layer structure may partially melt because of the large power input in the event of an electrostatic discharge or voltage spike.

According to various embodiments, a protective device in the form of a varistor layer structure is integrated into an optoelectronic component, without clearly altering its construction design; in other words, the optoelectronic component may include a multiplicity of layers, the varistor layer structure being integrated into one of these layers, it being for example possible for the optoelectronic component to include an encapsulation layer, a so-called thin-film encapsulation (TFE), the varistor layer structure being integrated into the encapsulation layer or provided as an encapsulation layer. Furthermore, the optoelectronic component may include an electrode layer structure, for example a so-called transparent conductive layer or a nontransparent metallization layer, the varistor layer structure being integrated into the electrode layer structure. In general, the layers of an optoelectronic component which are already conventionally present may be modified in such a way that, besides the conventionally provided function, they provide an additional function. In this way, the general structure of the optoelectronic component can be preserved, with a better performance and/or better reliability, or an extended lifetime.

According to various embodiments, overvoltage protection, heat dissipation and/or a capacitor structure may be integrated into the encapsulation layer of an optoelectronic component, or respectively configured as an encapsulation layer. Clearly, for example, the thin-film encapsulation of an organic light-emitting diode may have a multiple function. According to various embodiments an optoelectronic component may include at least the following: a functional layer structure which is electrically contacted by means of a first electrode structure and a second electrode structure; a thin-film encapsulation, which at least partially encapsulates the first electrode structure, the second electrode structure and/or the optically functional layer structure; the thin-film encapsulation including a varistor layer, a heat conduction layer, a sensor layer (for example configured as a temperature sensor or pressure sensor, or as part of a temperature sensor structure or pressure sensor structure), and/or a capacitor layer structure.

According to various embodiments, an optoelectronic component may include the following: a carrier; a first electrode structure (also referred to as a first electrode), which is arranged on the carrier; an optically functional layer structure, which is arranged at least partially over the first electrode structure; a second electrode structure (also referred to as a second electrode), which is arranged at least partially over the optically functional layer structure, the first electrode structure and the second electrode structure electrically contacting the optically functional layer structure; and at least one varistor layer structure, which is arranged between the first electrode structure and the second electrode structure and contacts the two electrode structures.

According to various embodiments, the optoelectronic component may emit electromagnetic radiation, and the optoelectronic component may for example be configured as a light-emitting diode or a laser diode. Furthermore, the optoelectronic component may be configured as an optical sensor or as a solar cell.

According to various embodiments, an (e.g. organic) optoelectronic component may include the following: a carrier; a first electrode structure, which is arranged on the carrier; an organic functional (e.g. optically functional) layer structure, which is arranged at least partially over the first electrode structure; a second electrode structure, which is arranged at least partially over the organic optically functional layer structure, the first electrode structure and the second electrode structure electrically contacting the organic optically functional layer structure; and at least one varistor layer structure, which is arranged between the first electrode structure and the second electrode structure and contacts the two electrode structures.

According to various embodiments, the (e.g. organic) optoelectronic component may emit electromagnetic radiation, and the optoelectronic component may for example be configured as an organic light-emitting diode or an organic laser diode. Furthermore, the optoelectronic component may be configured as an organic optical sensor or as an organic solar cell.

According to various embodiments, the organic optically functional layer structure may be operated at an operating voltage which, for example, is less than about 10 V. Furthermore, the organic optically functional layer structure may be degraded or even destroyed in the event of a voltage spike occurring with a maximum voltage of more than, for example, about 15 V. According to various embodiments, the varistor layer structure may be configured in such a way that the electrical resistance of the varistor layer structure (which by definition is voltage-dependent) decreases exponentially at a voltage of more than about 10 V (for example more than about 15 V or more than about 20 V), i.e. clearly the threshold voltage of the varistor layer structure (beyond which the differential resistance of the varistor layer structure decreases abruptly) may be provided in a range of from about 10 V to about 100 V (for example in a range of from about 10 V to about 30 V or in a range of from about 15 V to about 30 V). The threshold voltage may, for example, be adapted by means of modification of the layer thickness of the varistor layer structure (or clearly by means of modification of the cross section of the varistor layer structure in relation to the current path), and the threshold voltage may for example be reduced with an increasing layer thickness. Furthermore, the threshold voltage of the varistor layer structure may be adapted by adapting the material and/or the material composition of the varistor layer structure. Furthermore, the average grain size of the polycrystalline material of the varistor layer structure may be adapted, and the threshold voltage may for example be increased with an increasing average grain size.

According to various embodiments, the varistor layer structure may be provided as a layer having a layer thickness of more than 1 µm, 2 µm, 3 µm, 4 µm, 5 µm, 6 µm, 7 µm, 8 µm, 9 µm, or more than 10 µm, for example with a layer thickness in a range of from about 1 µm to about 50 µm.

The threshold voltage of the varistor layer structure (also referred to as the response voltage) should be configured to be above the rated voltage with which the optoelectronic component, i.e. the organic optically functional layer structure, is normally intended to be operated, since a varistor in principle does not have a reverse direction. Below the threshold voltage, the varistor may have an electrical resistance which is as high as possible, for example in a range of from about 50 kΩ to about 50 MΩ, or allow a small current flow, for example in a range of from about 0.1 µA to about 10 µA. In order to protect the optoelectronic component, the varistor layer structure may short-circuit the two electrode structures to one another above the threshold voltage, so that essentially no electrical current any longer flows through the organic optically functional layer structure, i.e. the electrical resistance of the varistor layer structure above the protection voltage should be very small in relation to the electrical resistance of the organic optically functional layer structure, for example in a range of from about 0Ω to about 20Ω, for example 0.2Ω.

According to various embodiments, the varistor layer structure may include a metal oxide or semimetal carbide having varistor properties (for example a corresponding current/voltage characteristic), for example zinc oxide, bismuth oxide, chromium oxide, manganese oxide, cobalt oxide or silicon carbide. According to various embodiments, the metal oxide or semimetal carbide having varistor properties may be polycrystalline. According to various embodiments, the metal oxide or semimetal carbide having varistor properties, i.e. the varistor layer structure, may be deposited by means of chemical vapor deposition or physical vapor deposition. As an alternative, the metal oxide or semimetal carbide having varistor properties, i.e. the varistor layer structure, may be applied in the form of a precursor layer, the precursor layer including the metal oxide or semimetal carbide in the form of particles or including the metal or semimetal in the form of a polymer, which is subsequently sintered.

According to various embodiments, the varistor layer structure may be configured as an encapsulation layer (also referred to as TFE), which is arranged at least partially over the second electrode structure and/or over the organic optically functional layer structure. According to various embodiments, the varistor layer structure may be configured as an encapsulation layer which at least partially encapsulates the organic optically functional layer structure.

According to various embodiments, the encapsulation layer may consist of a single layer or a layer stack which includes a plurality of layers, the single layer or at least one of the plurality of layers of the encapsulation layer consisting of a material having varistor properties.

According to various embodiments, the varistor layer structure may include polycrystalline silicon carbide (SiC). According to various embodiments, the varistor layer structure may consist of a single layer, i.e. the varistor layer structure may be a polycrystalline SiC layer. Furthermore, the varistor layer structure may consist of a layer stack having a plurality of layers, at least one layer of the plurality of layers of the layer stack including polycrystalline silicon carbide (SiC). In other words, at least one layer of the plurality of layers of the layer stack may be a polycrystalline SiC layer.

According to various embodiments, the optoelectronic component may furthermore include a heat conduction layer which is in direct contact with the varistor layer structure. According to various embodiments, the heat conduction layer may include aluminum nitride or consist of aluminum nitride.

For example, the encapsulation layer may consist of a layer stack having a plurality of layers, at least one layer of the plurality of layers of the layer stack being a polycrystalline SiC layer and another layer of the plurality of layers of the layer stack being an aluminum nitride layer.

According to various embodiments, the varistor layer structure may be arranged at least partially between the second electrode structure and the carrier. Furthermore, the varistor layer structure may be arranged at least partially between the organic optically functional layer structure and the carrier. Clearly, the varistor layer structure may be integrated into the layer plane of the first electrode structure.

According to another embodiment, the first electrode structure may include an optically transparent region (also referred to as a first electrode). In this case, the varistor layer structure may adjoin the optically transparent region. In other words, the optically transparent region of the first electrode structure and the varistor layer structure may be provided next to one another on the carrier.

According to various embodiments, the varistor layer structure and the optically transparent region of the first electrode structure may include the same material, i.e. be based on the same material. In this case, the material of the varistor layer structure may have a lower doping than the material of the electrode structure. For example, the optically transparent region of the first electrode structure may thus be electrically conductive because of the doping, and the varistor layer structure may have varistor properties because of the lower doping.

According to various embodiments, the material may be polycrystalline zinc oxide. Furthermore, the doping may be aluminum doping. For example, the varistor layer structure may include undoped zinc oxide and the optically transparent region of the first electrode structure may include aluminum-doped zinc oxide (AZO).

According to various embodiments, a method for producing an optoelectronic component may include the following: formation of a first layer structure on a carrier, the first layer structure including an optically transparent electrically conductive first electrode region (clearly a first electrode) and a varistor region, the varistor region (directly) adjoining the optically transparent electrically conductive electrode region; formation of an organic optically functional layer structure, which is arranged at least partially over the optically transparent electrically conductive electrode region; formation of an electrode structure (clearly a second electrode) which is arranged at least partially over the organic optically functional layer structure, the first electrode region and the electrode structure electrically contacting the organic optically functional layer structure, the electrode structure furthermore contacting the varistor region.

According to various embodiments, the first electrode and the second electrode may have no direct physical contact with one another, i.e. the two electrodes may be spatially separated from one another. Clearly, the organic optically functional layer structure, and parallel thereto the varistor region, may be connected between the two electrodes. In this case, the varistor region may bridge the organic optically functional layer structure when a voltage that is greater than the threshold voltage of the varistor region is applied between the two electrodes, the varistor region being provided in such a way that the threshold voltage is greater than the operating voltage for operating the organic optically functional layer structure and less than a maximum voltage of the organic optically functional layer structure, at which the latter is damaged.

For example, the operating voltage for operating the organic optically functional layer structure may lie in a range of from about 3 V to about 10 V, and the maximum voltage of the organic optically functional layer structure may be about 20 V, so that the threshold voltage of the varistor region may be provided between about 10 V and about 20 V. For example, the operating voltage for operating the organic optically functional layer structure may lie in a range of from about 5 V to about 15 V, and the maximum voltage of the organic optically functional layer structure may be about 25 V, so that the threshold voltage of the varistor region may be provided between about 15 V and about 25 V. For example, the operating voltage for operating the organic optically functional layer structure may lie in a range of from about 5 V to about 15 V, and the maximum voltage of the organic optically functional layer structure may be about 50 V, so that the threshold voltage of the varistor region may be provided between about 15 V and about 50 V.

For example, the operating voltage for operating the organic optically functional layer structure may lie in a range of from about 5 V to about 15 V, and the maximum voltage of the organic optically functional layer structure may be about 100 V, so that the threshold voltage of the varistor region may be provided between about 15 V and about 100 V.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 7 shows a method for producing an optoelectronic component in a schematic flowchart, according to various embodiments;

DETAILED DESCRIPTION

Figure 1:
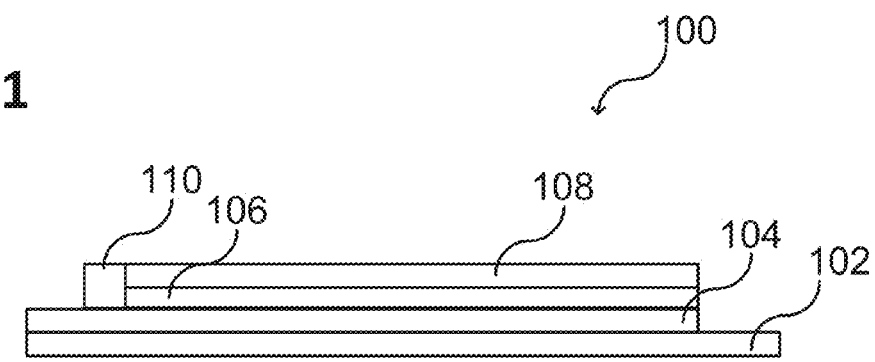
FIG. 1 shows an optoelectronic component in a schematic cross-sectional view, according to various embodiments.

In the following detailed description, reference is made to the appended drawings, which form part of this description and in which specific embodiments, in which the present disclosure may be carried out, are shown for illustration. In this regard, direction terminology such as "up", "down", "forward", "backward", "front", "rear", etc. is used with reference to the orientation of the figure or figures being described. Since component parts of embodiments may be positioned in a number of different orientations, the direction terminology is used for illustration and is in no way restrictive. It is to be understood that other embodiments may be used and structural or logical variations may be carried out, without departing from the protective scope of the present disclosure. It is to be understood that the features of the various exemplary embodiments described herein may be combined with one another, unless otherwise specifically indicated. The following detailed description is therefore not to be interpreted in a restrictive sense, and the protective scope of the present disclosure is defined by the appended claims.

In the scope of this description, the terms "connected" or "coupled" are used to describe both direct and indirect connection, and direct or indirect coupling. In the figures, elements which are identical or similar are provided with identical references, insofar as this is expedient.

In the scope of this description, a metal may include at least one metallic element, for example copper (Cu), silver (Ag), platinum (Pt), gold (Au), magnesium (Mg), aluminum (Al), barium (Ba), indium (In), calcium (Ca), samarium (Sm) or lithium (Li). Furthermore, a metal may include a metal compound (for example an intermetallic compound or an alloy), for example a compound of at least two metallic elements, such as for example bronze or brass, or for example a compound of at least one metallic element and at least one nonmetallic element, such as for example steel.

In the scope of this description, an optoelectronic component may be understood as an embodiment of an electronic component, the optoelectronic component including an optically active region. The optically active region may absorb electromagnetic radiation and form a photocurrent therefrom, or it may emit electromagnetic radiation by means of an applied voltage at the optically active region.

According to various embodiments an organic optically functional layer structure may include a plurality of organic and inorganic layers, which are stacked above one another and form a so-called layer stack. For example, more than three, more than four, more than five, more than six, more than seven, more than eight or more than nine layers may be formed above one another, for example more than ten, for example more than twenty layers.

Furthermore, an optoelectronic component may include at least the organic optically functional layer structure and a further layer, for example a layer configured as an electrode, a barrier layer and/or an encapsulation layer. As an alternative or in addition, the optoelectronic component may include a plurality of further layers, as mentioned above, for example in combination with one another.

The formation of a layer (for example of an organic layer, of a layer of the optically functional layer structure and/or of a layer of an optoelectronic component) may, for example, be carried out by means of liquid-phase processing. The liquid-phase processing may include dissolving or dispersing a substance for the layer (for example for an organic layer or an inorganic layer, for example a ceramic or metallic layer) in a suitable solvent, for example in a polar solvent such as water, dichlorobenzene, tetrahydrofuran and phenetole, or for example in a nonpolar solvent such as toluene or other organic solvents, for example in fluorine-based solvent, also referred to as perfluorinated solvent, in order to form a liquid phase of the layer.

Furthermore, the formation of the layer by means of liquid-phase processing may include forming, for example applying, the liquid phase of the layer by means of liquid-phase deposition (also referred to as a wet chemical method or wet chemical coating) on or over a surface to be coated (for example on or over the substrate or on or over another layer of the organically optoelectronic component).

As an alternative or in addition, the formation of a layer may be carried out by means of vacuum processing (also referred to as a vapor deposition method). Vacuum processing may include forming a layer (for example an organic layer and/or an inorganic layer) by means of one or more of the following methods: atomic layer deposition (ALD), sputtering, thermal evaporation, plasma-enhanced atomic layer deposition (PEALD), plasma-less atomic layer deposition (PLALD) or chemical vapor deposition (CVD), for example plasma-enhanced chemical vapor deposition (PECVD) or plasma-less chemical vapor deposition (PECVD).

According to various embodiments, the formation of a layer may be carried out in combination with a mask (also referred to as a shadow mask or template). The mask may, for example, include a pattern which can be imaged onto or over the coated surface so that the coated surface has the shape of the pattern. For example, the pattern may be formed by means of a through-opening in the mask, for example in a plate. The material (i.e. as its gas phase or liquid phase) of the layer may pass onto or over the surface to be coated through the through-opening. For example, a recess may be formed in a layer by means of a mask.

As an alternative or in addition, the formation of at least some layers may be carried out by means of vacuum processing and of other layers by means of liquid-phase processing, i.e. by means of so-called hybrid processing in which at least one layer (for example three or more layers) are processed from a solution (i.e. as a liquid phase) and the remaining layers are processed in a vacuum.

The formation of a layer may be carried out in a processing chamber, for example in a vacuum processing chamber or in a liquid-phase processing chamber.

One or more layers, for example organic layers of the organically optoelectronic component may be crosslinked with one another, for example after they have been formed. In this case, a multiplicity of individual molecules of the layers may be linked to one another to form a three-dimensional network. This may improve the durability of the organically optoelectronic component, for example in relation to solvents and/or environmental influences.

FIG. 1 illustrates an optoelectronic component 100 in a schematic view, according to various embodiments. The optoelectronic component 100 may include a carrier 102. A first electrode structure 104 (also referred to as a first electrode) may be arranged on the carrier 102. Furthermore, an (e.g. organic) optically functional layer structure 106 may be arranged at least partially over the first electrode structure 104. Furthermore, a second electrode structure 108 may be arranged at least partially over the (e.g. organic) optically functional layer structure 106. In this case, the first electrode structure 104 and the second electrode structure 108 may electrically contact the (e.g. organic) optically functional layer structure 160.

According to various embodiments, at least one varistor layer structure 110 may be arranged between the first electrode structure 104 and the second electrode structure 108, the varistor layer structure 110 contacting the two electrode structures 104, 108. Clearly, the varistor layer structure 110 may be configured in parallel with the optically functional layer structure 106 in the switching principle of the optoelectronic component 100, the varistor layer structure 110 acting as an insulator for a low electrical voltage (for example less than 10 V, 15 V or more than 50 V) which is applied between the two electrode structures 104, 108, so that essentially all the electrical current flows through the organic optically functional layer structure 106. For a high electrical voltage (for example more than 15 V, 20 V, 55 V, 100 V or even more than 500 V; or clearly for an ESD or a voltage spike), which is induced between the two electrode structures 104, 108, the varistor layer structure 110 may act as an electrical conductor so that the electrical current essentially flows away through the varistor layer structure 110 and not through the organic optically functional layer structure 106. Clearly, the two electrode structures 104, 108 are bridged, or short-circuited, by the varistor layer structure 110 only in the event of high electrical voltages.

As illustrated in FIG. 1, the varistor layer structure 110 may at least partially extend laterally next to the optically functional layer structure 106, the varistor layer structure 110 being in direct physical contact with the two electrode structures 104, 108.

In principle, the organic optically functional layer structure 106 may include at least one material which emits light (for example visible light, infrared light and/or ultraviolet light) because of an operating voltage provided between the two electrode structures 104, 108. An organic optically functional layer structure 106 may be configured in order to convert an electrical current into electromagnetic radiation and/or in order to convert electromagnetic radiation into an electrical current.

Figure 2:
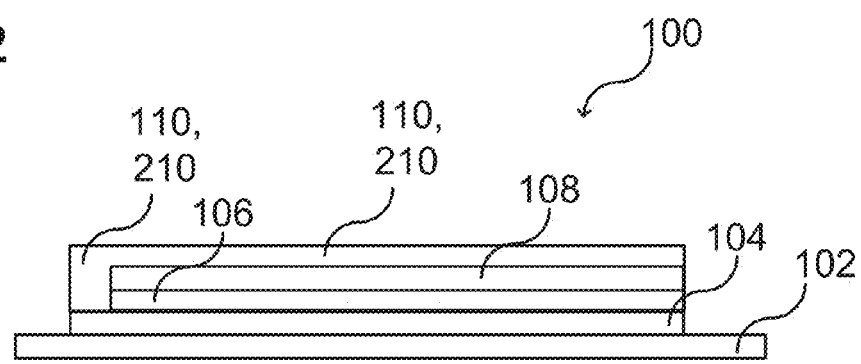
FIG. 2 shows an optoelectronic component in a schematic cross-sectional view, according to various embodiments.

FIG. 2 illustrates an optoelectronic component 100 in a schematic view, according to various embodiments. The optoelectronic component 100 may, as is described above, include a carrier 102, two electrode structures 104, 108 and an optically functional layer structure 106 arranged between the two electrode structures 104, 108.

According to various embodiments, the varistor layer structure 110 of the optoelectronic component 100 may be configured as an encapsulation layer 210. The encapsulation layer 210 may, for example, be arranged at least partially (for example partially or fully) over the second electrode structure 108 and/or over the organic optically functional layer structure 106. The encapsulation layer 210 may, for example, be referred to as TFE (thin-film encapsulation). Furthermore, the encapsulation layer 210 may be referred to as an encapsulation structure 210, in which case the encapsulation structure 210 may, for example, include the varistor layer structure 110.

So that the varistor layer structure 110 can simultaneously function as an encapsulation layer 210, it may be a polycrystalline SiC layer. Optionally, further layers may naturally be integrated in the encapsulation layer 210, i.e. the encapsulation layer 210 may include a layer stack of a plurality of layers. For example, a heat conduction layer may be applied on the varistor layer structure 110. For example, in a case in which the electrical current of a voltage spike needs to be dissipated by means of the varistor layer structure 110, the varistor layer structure 110 may be cooled by means of the heat conduction layer (cf. FIG. 4B).

Figure 3:
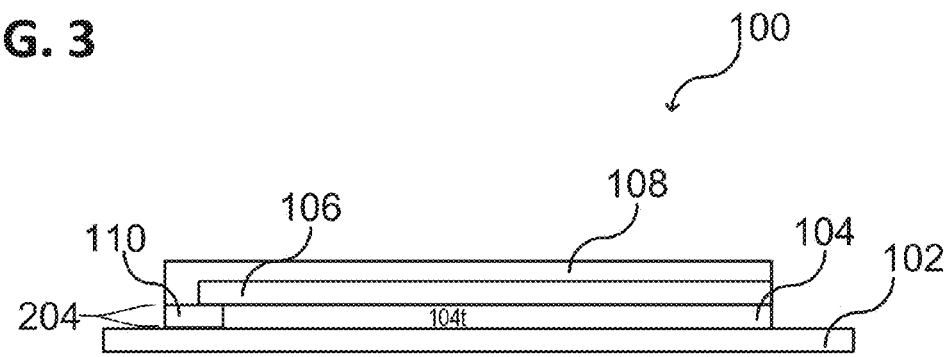
FIG. 3 shows an optoelectronic component in a schematic cross-sectional view, according to various embodiments.

FIG. 3 illustrates an optoelectronic component 100 in a schematic view, according to various embodiments. The optoelectronic component 100 may, as described above, include a carrier 102, two electrode structures 104, 108 and an optically functional layer structure 106 arranged between the two electrode structures 104, 108.

According to various embodiments, the varistor layer structure 110 of the optoelectronic component 100 may be arranged at least partially between the second electrode structure 108 and the carrier 102, or between the organic optically functional layer structure 106 and the carrier 108. For example, the varistor layer structure 110 and the first electrode structure 104 may essentially have the same layer thickness. In this case, the optically functional layer structure 106 may then be formed only over the first electrode structure 104 or also partially over the varistor layer structure 110. Furthermore, the second electrode structure 108 may have direct physical contact with the varistor layer structure 110. For example, the second electrode structure 108 may partially enclose the optically functional layer structure 106.

Furthermore, an encapsulation layer (not represented) may be provided over the second electrode structure 108 and/or over the optically functional layer structure 106 and/or over the varistor layer structure 110. Clearly, the encapsulation layer encapsulates the corresponding component parts of the optoelectronic component 100, so that they may for example be protected against external influences (for example moisture and/or oxygen).

The first electrode structure 104 may include an optically transparent region 104t, such as is illustrated for example in FIG. 3. Furthermore, the carrier 102 may be transparent in sections or entirely. For example, light which is generated by the optically functional layer structure 106 can therefore be emitted through the optically transparent region 104t of the first electrode structure 104 and the carrier 102. In this case, the varistor layer structure 110 may adjoin the optically transparent region 104t of the first electrode structure 104. According to various embodiments, the varistor layer structure 110 and the optically transparent region 104t of the first electrode structure 104 may include the same material.

Furthermore, the first electrode structure 104 may be configured as a transparent electrically conductive layer, the varistor layer structure 110 and the first electrode structure 104 including the same material, for example a metal oxide, for example ZnO. In this case, the material of the varistor layer structure may have a lower doping than the material of the electrode structure.

Figure 8:
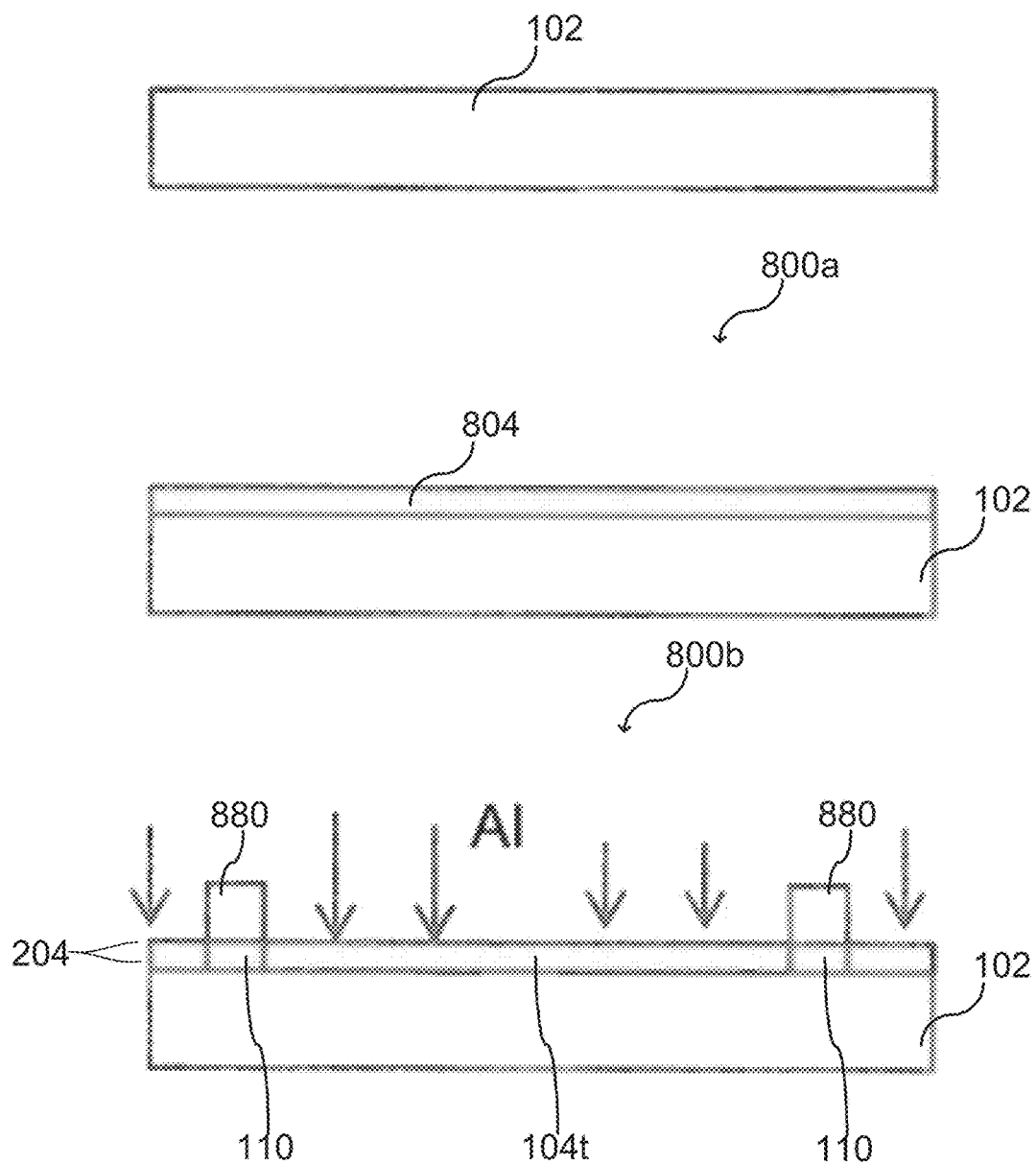
FIG. 8 shows a carrier for an optoelectronic component in various schematic cross-sectional views during production, according to various embodiments.
Figure 9:
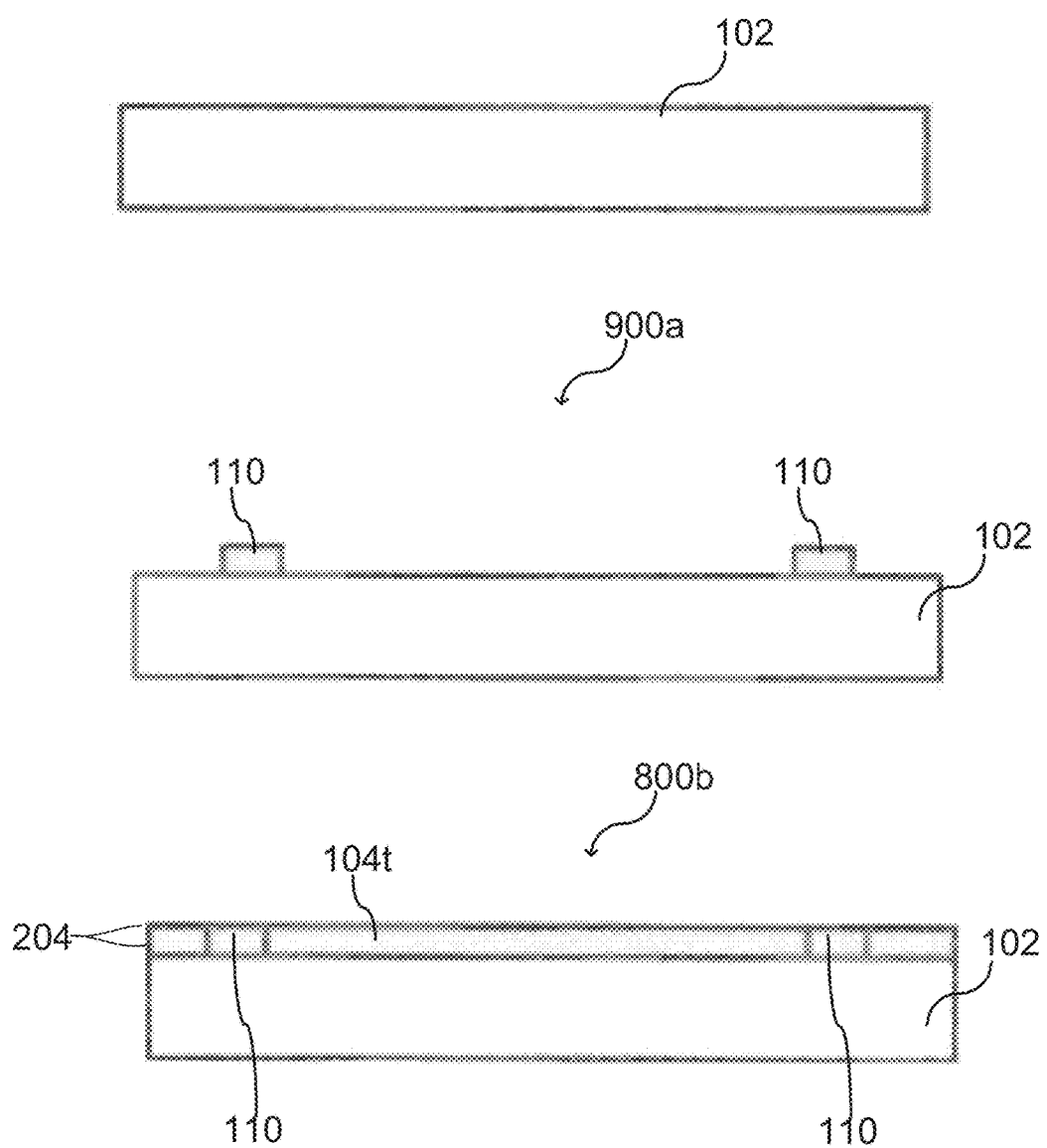
FIG. 9 shows a carrier for an optoelectronic component in various schematic cross-sectional views during production, according to various embodiments.

Clearly, a metal oxide layer 204, which is doped in an electrode region 104 in such a way that the doped metal oxide layer is transparent and electrically conductive in the electrode region 104, may be provided on the carrier 102, the metal oxide layer furthermore being undoped, or only very weakly doped (for example less than 0.1 atomic percent), in a varistor region 110, so that the undoped metal oxide layer has varistor properties in the varistor region 110 (cf. for example FIG. 8 and FIG. 9).

Figure 6A:
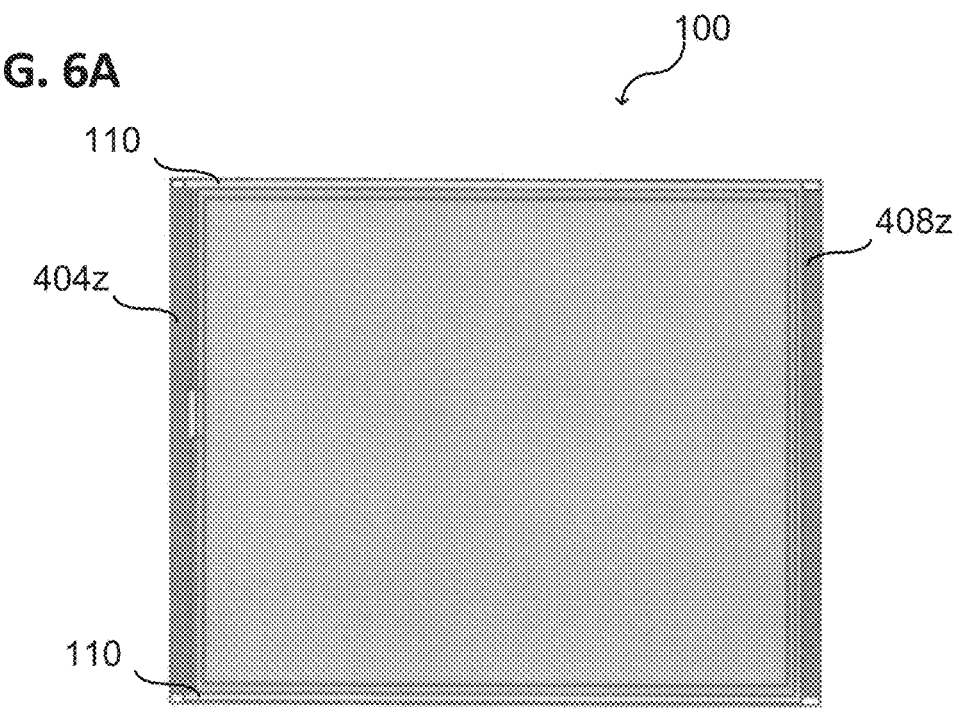
FIG. 6A shows an optoelectronic component in a schematic plan view, according to various embodiments.
Figure 6B:
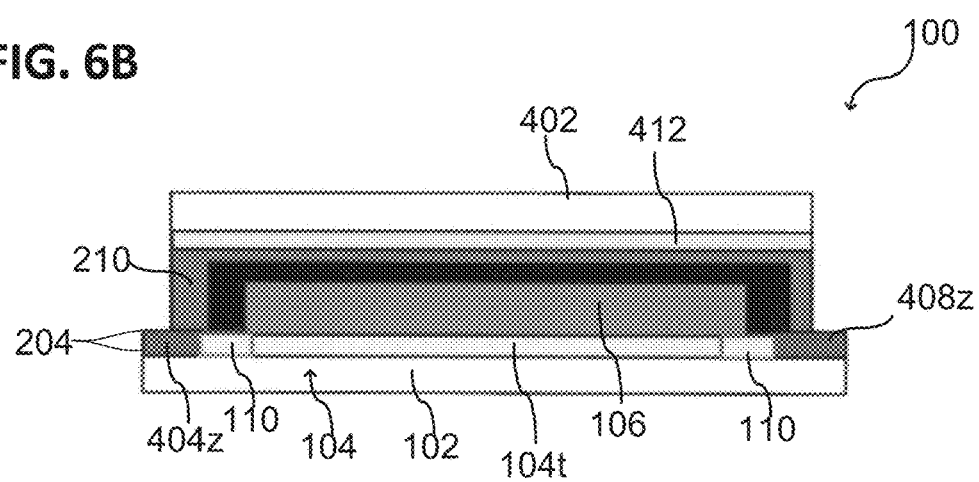
FIGS. 6B and 6C respectively show an optoelectronic component in a schematic cross-sectional view, according to various embodiments.

For example, the varistor layer structure 110 and the first electrode structure 104 may therefore be provided by only a single layer 204 (cf. FIG. 6A and FIG. 6B). According to various embodiments, the material of the layer 204 (i.e. the material of the varistor layer structure 110 and of the first electrode structure 104) may be polycrystalline zinc oxide, the doping in the optically transparent region 104t of the first electrode structure 104 (or of the entire first electrode structure 104) being aluminum doping. According to various embodiments, the material of the layer 204 (i.e. the material of the varistor layer structure 110 and of the first electrode structure 104) may be polycrystalline tin oxide, the doping in the optically transparent region 104t of the first electrode structure 104 (or of the entire first electrode structure 104) being indium doping, antimony doping or fluorine doping.

As is described here according to various embodiments, the optoelectronic component 100 may include at least one organic optically functional layer structure 106. The organic optically functional layer structure 106 may include one, two or more functional layer structure units, and one, two or more intermediate layer structures between the layer structure units. The organic optically functional layer structure 106 may for example include a first organic optically functional layer structure unit, an intermediate layer structure and a second organic optically functional layer structure unit.

The first electrode 104 (i.e. the first electrode structure 104) may be configured as an anode or as a cathode. The first electrode 104 may include or be formed from one of the following electrically conductive material: a metal; a transparent conductive oxide (for example indium tin oxide (ITO), fluorine tin oxide (PTO), aluminum zinc oxide (AZO) and antimony tin oxide (ATO)); a network of metallic nanowires and nanoparticles; a network of carbon nanotubes; graphene particles and layers; a network of semiconducting nanowires; an electrically conductive polymer; a transition metal oxide or transition metal nitride; and/or composites thereof. The first electrode 104, or the first electrode structure 104, which consists of a metal or includes at least one metal, may include or be formed from one of the following materials: Ag, Pt, Au, Mg, Al, Ba, In, Ca, Sm or Li, as well as compounds, combinations or alloys of these materials. The first electrode 104 may include a layer or a layer stack of a plurality of layers of the same material or different materials.

The first electrode 104 may for example have a layer thickness in a range of from 10 nm to 500 nm, for example from less than 25 nm to 250 nm, for example from 50 nm to 100 nm. The first electrode 106 may include or be electrically connected to a first electrical contact region (cf. for example FIG. 4A) to which a first electrical potential can be applied. The first electrical potential may be provided by an energy source, for example a current source or a voltage source.

As an alternative, a substrate 102 which is electrically conductive at least in sections may be used, in order to apply the first electrical potential to the first electrode 104 by means of the electrically conductive substrate 102. The first electrical potential may, for example, be the ground potential or another predetermined reference potential.

In various exemplary embodiments, the organic optically functional layer structure 106 includes one, two or even more than two organic optically functional layer structures.

The first organic optically functional layer structure unit and the optionally further organically functional layer structures may be configured in the same way or in different ways, and may for example include the same emitting material or a different emitter material. The second organic optically functional layer structure unit, or the further organically functional layer structure units, may be configured as one of the exemplary embodiments described below for the first organically functional layer structure unit.

The first organic optically functional layer structure unit may include a hole injection layer, a hole transport layer, an emitter layer, an electron transport layer and an electron injection layer.

In an organically functional layer structure unit, one or more of the aforementioned layers may be provided, in which case identical layers may have physical contact, may only be electrically connected to one another, or even may be configured to be electrically insulated from one another, for example may be formed next to one another. Individual layers of the aforementioned layers may be optional.

A hole injection layer may be formed on or over the first electrode 104. The hole injection layer may include or be formed from one or more of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)-benzidine); beta-NPB (N,N'-bis(naphthalen-2-yl)-N,N'-bis(phenyl)-benzidine); TPD (N,N'-bis(3-methylphenyl)-N,N'-bis(phenyl)-benzidine); spiro-TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(n,n-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorine; 9,9-bis[4-(N,N'-bis-naphthalen-2-yl-N,N'-bis-phenyl-amino)-phenyl]-9H-fluorine; N,N'-bis(phenanthren-9-yl)-N,N'-bis(phenyl)-benzidine; 2,7-bis[N,N-bis(9,9-spiro-bifluoren-2-yl)-amino]-9,9-spiro-bifluorene; 2,2'-bis[N,N-bis(biphenyl-4-yl)amino]9,9-spiro-bifluorene; 2,2'-bis(N,N-diphenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and/or N,N,N',N'-tetra-naphthalen-2-yl-benzidine.

The hole injection layer may have a layer thickness in a range of from approximately 10 nm to approximately 1000 nm, for example in a range of from approximately 30 nm to approximately 300 nm, for example in a range of from approximately 50 nm to approximately 200 nm.

A hole transport layer may be formed on or over the hole injection layer. The hole transport layer may include or be formed from one or more of the following materials: NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro-TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(n,n-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorine; N,N'-bis(phenanthren-9-yl)-N,N'-bis(phenyl)-benzidine; 2,7-bis[N,N-bis(9,9-spiro-bifluoren-2-yl)-amino]-9,9-spiro-bifluorene; 2,2'-bis[N,N-bis(biphenyl-4-yl)amino]9,9-spiro-bifluorene; 2,2'-bis(N,N-diphenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and N,N,N',N'-tetra-naphthalen-2-yl-benzidine, a tertiary amine, a carbazole derivative, a conductive polyaniline and/or polyethylenedioxythiophene.

The hole transport layer may have a layer thickness in a range of from approximately 5 nm to approximately 50 nm, for example in a range of from approximately 10 nm to approximately 30 nm, for example approximately 20 nm.

An emitter layer may be formed on or over the hole transport layer. Each of the organically functional layer structure units may respectively include an emitter layer or a plurality of emitter layers, for example having fluorescent and/or phosphorescent emitters.

An emitter layer may include or be formed from organic polymers, organic oligomers, organic monomers, nonpolymeric organic small molecules, or a combination of these materials.

The optoelectronic component 100 may include or be formed from one or more of the following materials in an emitter layer: organic or organometallic compounds such as derivatives of polyfluorene, polythiophene and polyphenylene (for example 2- or 2,5-substituted poly-p-phenylene vinylene), as well as metal complexes, for example iridium complexes such as blue phosphorescent FlrPic (bis(3,5-difluoro-2-(2-pyridyl)phenyl-(2-carboxypyridyl)-iridium III), green phosphorescent $Ir(ppy)_3$ (tris(2-phenylpyridine) iridium III), red phosphorescent $Ru(dtb-bpy)_3*2(PF_6)$ (tris [4,4'-di-tert-butyl-(2,2')-bipyridine]ruthenium(III) complex) and blue fluorescent DPAVBi (4,4-bis[4-(di-p-tolylamino) styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyran) as nonpolymeric emitters.

The emitter materials may be suitably embedded in a matrix material, for example a technical ceramic or a polymer, for example an epoxide; or a silicone.

In various exemplary embodiments, the emitter layer may have a layer thickness in a range of from approximately 5 nm to approximately 50 nm, for example in a range of from approximately 10 nm to approximately 30 nm, for example approximately 20 nm.

The emitter layer may include emitter materials emitting in one color or different colors (for example blue and yellow or blue, green and red). As an alternative, the emitter layer may include a plurality of sublayers which emit light of different colors. As an alternative, provision may also be made to arrange a converter material in the beam path of the primary emission generated by these layers, which material at least partially absorbs the primary radiation and emits secondary radiation with a different wavelength.

The organic optically functional layer structure unit 106 may include one or more emitter layers which is/are configured as a hole transport layer. Furthermore, the organic optically functional layer structure unit 106 may include one or more emitter layers which is/are configured as an electron transport layer.

An electron transport layer may be formed, for example deposited, on or over the emitter layer.

The electron transport layer may include or be formed from one or more of the following materials: NET-18; 2,2',2"-(1,3,5-benzinetriyl)-tris(1-phenyl-1-H-benzimidazoles); 2-(4-biphenylyl)-5-(4-tert-butylphenyl)-1,3,4-oxadiazoles; -2,9-dimethyl-4,7-diphenyl-1,10-phenanthrolines (BCP); 8-hydroxyquinolinolato-lithium, 4-(naphthalen-1-yl)-3,5-diphenyl-4H-1,2,4-triazoles; 1,3-bis[2-(2,2'-bipyridin-6-yl)-1,3,4-oxadiazo-5-yl]benzenes; 4,7-diphenyl-1,10-phenanthrolines (BPhen); 3-(4-biphenylyl)-4-phenyl-5-tert-butylphenyl-1,2,4-triazoles; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)-anthracenes; 2,7-bis[2-(2,2'-bipyridine-6-yl)-1,3,4-oxadiazo-5-yl]-9,9-dimethylfluorenes; 1,3-bis[2-(4-tert-butylphenyl)-1,3,4-oxadiazo-5-yl]benzenes; 2-(naphthalen-2-yl)-4,7-diphenyl-1,10-phenanthrolines; 2,9-bis(naphthalen-2-yl)-4,7-diphenyl-1,10-phenanthrolines; tris(2,4,6-trimethyl-3-(pyridin-3-yl)phenyl)boranes; 1-methyl-2-(4-(naphthalen-2-yl)phenyl)-1H-imidazo[4,5-f][1,10]phenanthroline; phenyl-dipyrenylphosphine oxides; naphthalenetetracarboxylic dianhydride or imides thereof; perylenetetracarboxylic dianhydride or imides thereof; and substances based on siloles having a silacyclopentadiene unit.

The electron transport layer may have a layer thickness in a range of from approximately 5 nm to approximately 50 nm, for example in a range of from approximately 10 nm to approximately 30 nm, for example approximately 20 nm.

An electron injection layer may be formed on or over the electron transport layer. The electron injection layer may include or be formed from one or more of the following materials: NDN-26, MgAg, $Cs_2CO_3$, $Cs_3PO_4$, Na, Ca, K, Mg, Cs, Li, LiF; 2,2',2"-(1,3,5-benzinetriyl)-tris(1-phenyl-1-H-benzimidazoles); 2-(4-biphenylyl)-5-(4-tert-butylphenyl)-1,3,4-oxadiazoles; 2,9-dimethyl-4,7-diphenyl-1,10-phenanthrolines (BCP); 8-hydroxyquinolinolato-lithium, 4-(naphthalen-1-yl)-3,5-diphenyl-4H-1,2,4-triazoles; 1,3-bis[2-(2,2'-bipyridin-6-yl)-1,3,4-oxadiazo-5-yl]benzenes; 4,7-diphenyl-1,10-phenanthrolines (BPhen); 3-(4-biphenylyl)-4-phenyl-5-tert-butylphenyl-1,2,4-triazoles; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)-anthracenes; 2,7-bis[2-(2,2'-bipyridine-6-yl)-1,3,4-oxadiazo-5-yl]-9,9-dimethylfluorenes; 1,3-bis[2-(4-tert-butylphenyl)-1,3,4-oxadiazo-5-yl]benzenes; 2-(naphthalen-2-yl)-4,7-diphenyl-1,10-phenanthrolines; 2,9-bis(naphthalen-2-yl)-4,7-diphenyl-1,10-phenanthrolines; tris(2,4,6-trimethyl-3-(pyridin-3-yl)phenyl)boranes; 1-methyl-2-(4-(naphthalen-2-yl)phenyl)-1H-imidazo[4,5-f][1,10]phenanthrolines; phenyl-dipyrenylphosphine oxides; naphthalenetetracarboxylic dianhydride or imides thereof; perylenetetracarboxylic dianhydride or imides thereof; and substances based on siloles having a silacyclopentadiene unit.

The electron injection layer may have a layer thickness in a range of from approximately 5 nm to approximately 200 nm, for example in a range of from approximately 20 nm to approximately 50 nm, for example approximately 30 nm.

In the case of an organically functional layer structure 106 having two or more organically functional layer structure units, the second organic optically functional layer structure unit may be formed over or beside the first functional layer structure units. An intermediate layer structure may be formed electrically between the organically functional layer structure units.

In various exemplary embodiments, the intermediate layer structure may be configured as an intermediate electrode, for example according to one of the exemplary embodiments of the first electrode. An intermediate electrode may be electrically connected to an external voltage source. The external voltage source may, for example, provide a third electrical potential to the intermediate electrode. The intermediate electrode may also, however, not include an external electrical terminal, for example with the intermediate electrode having a floating electrical potential.

In various exemplary embodiments, the intermediate layer structure may be configured as a charge carrier pair generation layer structure (charge generation layer CGL). A charge carrier pair generation layer structure may include one or more electron-conducting charge carrier pair generation layers and one or more hole-conducting charge carrier pair generation layers. The electron-conducting charge carrier pair generation layer(s) and the hole-conducting charge carrier pair generation layer(s) may respectively be formed from an undoped conductive substance or a dopant in a matrix. The charge carrier pair generation layer structure should be configured, in terms of the energy levels of the electron-conducting charge carrier pair generation layer(s) and the hole-conducting charge carrier pair generation layer(s), in such a way that electron and hole separation can take place at the interface of an electron-conducting charge carrier pair generation layer with a hole-conducting charge carrier pair generation layer. The charge carrier pair generation layer structure may furthermore have a permeation barrier between neighboring layers.

The second electrode 108 may be formed on or over the organically optically functional layer structure 106 or optionally on or over the one or more other of the organically functional layer structure and/or organically functional layers.

The second electrode 108, or the second electrode structure 108, may be configured according to one of the exemplary embodiments of the first electrode 104, it being possible for the first electrode 104 and the second electrode 108 to be configured identically or differently. The second electrode 108 may be configured as an anode, i.e. as a hole-injecting electrode, or as a cathode, i.e. as an electron-injecting electrode.

Figure 4A:
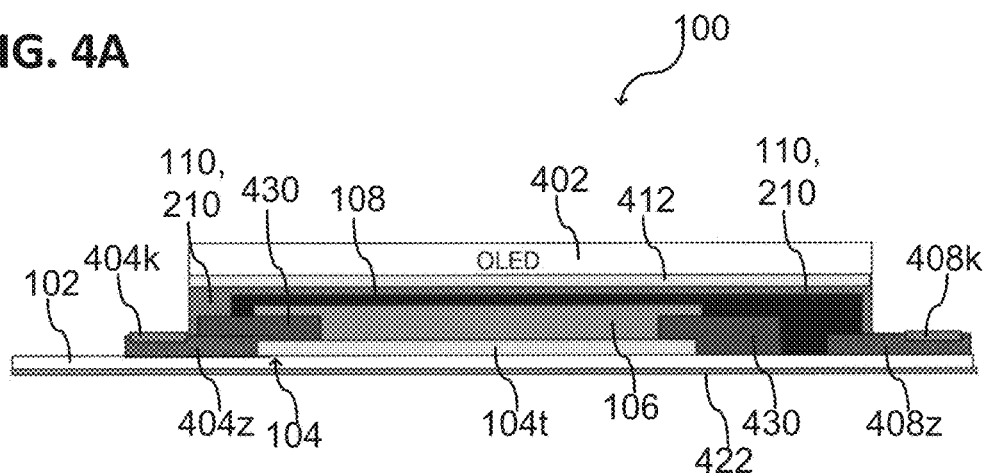
FIGS. 4A to 4C respectively show an optoelectronic component in a schematic cross-sectional view, according to various embodiments.

The second electrode 108 may include or be connected to a second electrical contact region (cf. for example FIG. 4A). A second electrical potential may be applied to the second electrical contact region. The second electrical potential may be provided by the same energy source or a different energy source than the first electrical potential and/or the optional third electrical potential of an intermediate electrode. The second electrical potential may be different to the first electrical potential and/or the optionally third electrical potential. The second electrical potential may, for example, have a value such that the difference from the first electrical potential has a value in a range of from about 1.5 V to about 20 V, for example a value in a range of from about 2.5 V to about 15 V, for example a value in a range of from about 3 V to about 12 V.

In various exemplary embodiments, the first electrode 104 is electrically insulated from the second electrode 108 by means of a resist (cf. for example FIG. 4A). The resist may, for example, be a polyimide or a resin or include a polyimide or a resin.

Figure 4B:
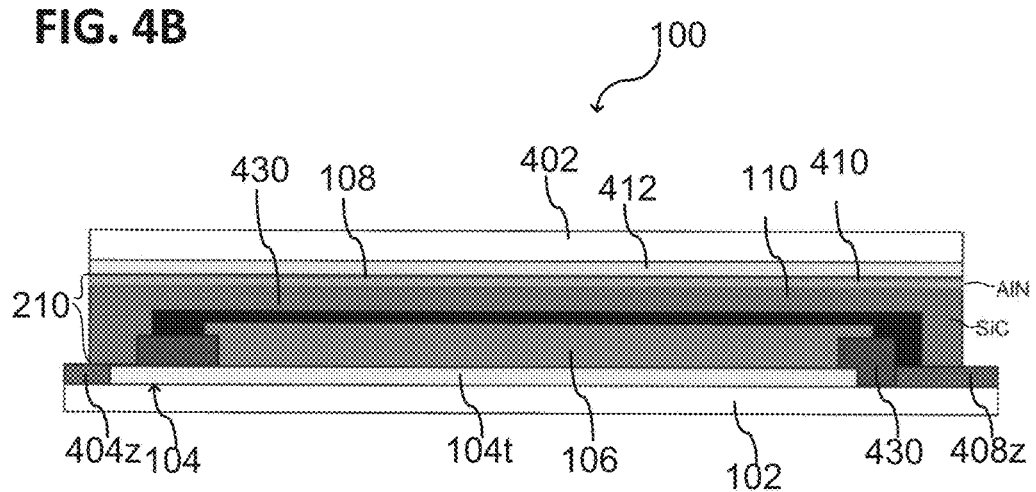
Figure 4C:
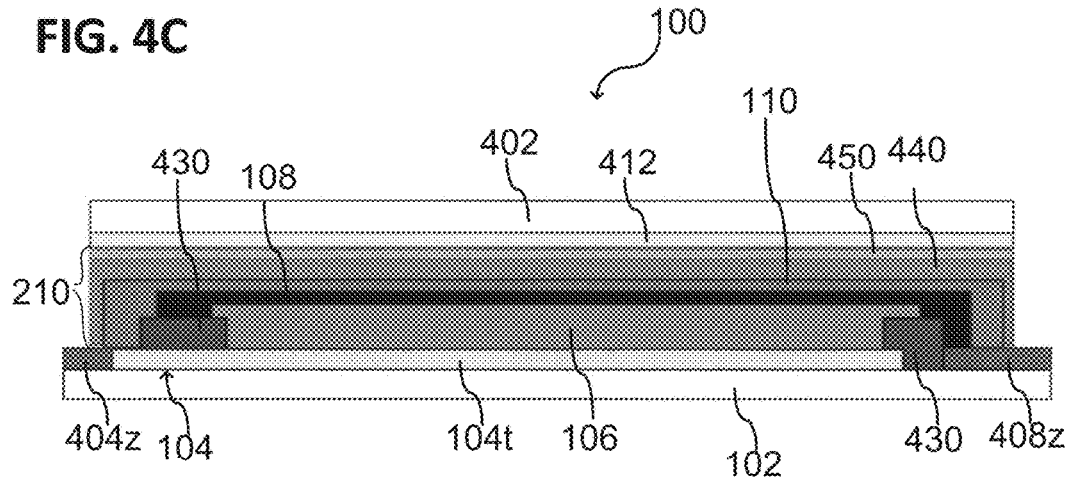

In various exemplary embodiments, the encapsulation structure 210 (for example on or over the varistor layer structure 110) includes a housing, a cover, a molding compound and/or one or more barrier layers (cf. for example FIGS. 4A to 4C). The molding compound may, for example, be or include a synthetic resin or an adhesive. The encapsulation structure 210 may have a permeation of less than about $10^{-6}$ g/(m$^2$d).

In various exemplary embodiments, the encapsulation structure 210 includes a molding compound, for example a synthetic resin or an adhesive. In various exemplary embodiments, the molding compound forms a housing for the optoelectronic component 100.

The encapsulation structure 210 may furthermore include a cover, the cover being arranged over the barrier layer, for example by means of a connecting layer. The cover may be connected to the barrier layer by means of a connecting layer. As an alternative, a cavity is formed between the cover and the barrier layer. According to various embodiments, the varistor layer structure 110 may function as a barrier layer of the encapsulation structure 210.

In other words: in various exemplary embodiments, the encapsulation structure 210 may include a cover and a connecting layer. A cover may be formed or arranged on or over the connecting layer. The cover may be connected by means of the connecting layer to the barrier layer, to the substrate 102 and/or to the electrically active region 106.

The cover may for example be a glass cover, a metal foil cover or a sealed plastic film cover. The glass cover may, for example, be connected to the barrier layer, or to the electrically active region 106, and/or to the substrate 102 by means of a frit connection (glass frit bonding/glass soldering/seal glass bonding) by means of a conventional glass solder in the geometrical edge regions of the electronic component 100.

The cover and/or the connecting layer may have a refractive index (for example at a wavelength of 633 nm) of 1.55.

In various exemplary embodiments in the case of an encapsulation structure 210 having a cover, a connecting layer is optional, for example if the cover is formed directly on the barrier layer (or for example, according to various embodiments, directly on the varistor layer structure 110), for example a glass cover which is formed by means of plasma spraying.

In various exemplary embodiments, a cover and/or a connecting layer, for example in the form of a resin layer, is optional. The barrier layer may, for example, be used as a substitute and/or instead of the cover.

In other words: in various exemplary embodiments, a connecting layer, for example of an adhesive or a varnish, is be provided on or over the barrier layer. By means of the connecting layer, for example, a cover may be connected, for example adhesively bonded, on the barrier layer.

A connecting layer of a transparent material may, for example, include particles which scatter electromagnetic radiation, for example light-scattering particles. In this way, the connecting layer may act as a scattering layer and lead to an improvement of the hue distortion and of the output efficiency.

The connecting layer may have a layer thickness of more than 1 µm, for example a layer thickness of several µm. In various exemplary embodiments, the connecting layer may include or be a lamination adhesive.

The connecting layer may be configured in such a way that it includes an adhesive having a refractive index which is less than the refractive index of the cover. Furthermore, a plurality of different adhesives that form an adhesive layer sequence may be provided.

Furthermore, in various exemplary embodiments, one or more input/output layers may additionally be formed in the electronic component 100, for example an external output film on or over the substrate (cf. for example FIG. 4A) or an internal output layer (not represented) in the layer cross section of the optoelectronic component 100. The input/output layer may include a matrix and scattering centers distributed therein, the average refractive index of the input/output layer being greater or less than the average refractive index of the layer from which the electromagnetic radiation is provided. Furthermore, in various exemplary embodiments, one or more antireflection layers (for example combined with the barrier layer) may additionally be provided in the optoelectronic component 100.

A so-called getter layer or getter structure, for example a laterally structured getter layer, may furthermore be arranged on or over the electrically active region 106 (also referred to as the optically functional layer structure 106) and/or the substrate 102.

In various embodiments, electromagnetic radiation is generated from an electrical current, or vice versa, in the electrically active region 106 during operation of the electronic component. The electrically active region 106 is configured in such a way, for example with transparent or translucent layers or structures, that the electromagnetic radiation can be transmitted at least through one side (optically active side). For example, the electrically active region may be configured in such a way that it includes two optically active sides lying opposite one another, for example may be transparent or translucent in a viewing direction. The optoelectronic component 100 may be configured in such a way that the electromagnetic radiation can be transmitted laterally and/or over the surface through the substrate 102, the barrier layer (or according to some exemplary embodiments the varistor layer structure 110), the connecting layer and/or the cover. As an alternative, one of the aforementioned layers or structures may be configured to be reflective or specular, so that electromagnetic radiation incident on this layer or structure can be deviated by this layer or structure.

The electronic component 100 can be contacted, for example supplied with current, by means of contact regions with an electrical energy source external to the component. The electronic component is configured in such a way that an electrical current can flow from the contact regions indirectly, for example through a connecting layer, or directly, for example by means of an electrode, extended into a contact region, of the electrically active region, electrically with the electrically active region 106, and vice versa. The current path of the electrical current passes through the electrically active region 106 from one contact region to the other contact region. The electrically active region 106 is configured in such a way that a predetermined electrical effect can be induced, and for example electromagnetic radiation and/or an electric field and/or a magnetic field can be generated. As an alternative or in addition, an electrical current may be generated in the electrically active region 106 from such radiation or such a field. As an alternative or in addition, the electrically active region 106 may include one or more circuits, for example having one or more switches, for example electrically switchable switches, for example transistors, for example in the form of a logic circuit.

Various modifications and configurations of the optoelectronic component 100 and details about the optically functional layer structure 106 and the varistor layer structure 110 will be described below, the basic features and functionalities described above being similarly includable. Furthermore, the features and functionalities described below may be applied similarly to the optoelectronic component 100 described in FIGS. 1 and 2, or combined with the optoelectronic component 100 described in FIGS. 1 and 2.

In general, optoelectronic components, for example OLEDs, may react very sensitively to perturbations, for example voltage spikes, the effect of temperature, etc. According to various embodiments, at least one of these perturbations is eliminated by means of functional material properties in the encapsulation 210 (for example without entailing additional costs) or an additional functionality (in addition to the barrier function) of the encapsulation 210 is provided.

Conventionally, an external protective diode is applied by means of connecting technology in order to protect a component. This, for example, causes additional costs. Furthermore, external protective diodes or varistors may conventionally be used in the electronic circuit (for example avalanche diodes). An external suppressor diode may also be used. Purely external electronic circuits, for example by means of filters, inductors, etc., may also be used in order to protect the component. For example, gas-filled overvoltage protection switches (for example for high powers) are used, as well as diode combinations with hard or soft dissipation of overvoltages.

According to various embodiments, an optoelectronic component 100 is provided, which is configured in such a way that its encapsulation layers combine a plurality of functionalities, one functionality being the encapsulation itself (for example the barrier function). As described above, a further functionality may be the varistor function for protecting the optoelectronic component 100. Furthermore, a further functionality may be the dissipation of heat.

According to various embodiments, SiC (silicon carbide) is used in the encapsulation of the optoelectronic component 100 (for example an OLED) as a relatively thick TFE layer (for example having a thickness of more than 1 µm, 2 µm, 3 µm, 4 µm or 5 µm). In this case, the silicon carbide of the encapsulation also has the property that its electrical resistance can decrease by several decades at high voltages (varistor property). Voltage spikes can therefore be smoothed out by dissipating the current through the thin-film encapsulation 210 in the event of high voltages. In this case, the SiC 110 acts as an insulator between the anode and the cathode during normal operation (in the absence of voltage spikes), and as a varistor between the anode and the cathode in the event of an overvoltage, so that in the event of an overvoltage the SiC 110 short-circuits the anode and cathode and thereby protects them.

At the same time, further layers may be introduced in a functional structure, for example for a temperature sensor as an NTC thermistor or PTC thermistor, for example for a capacitor, a piezo sensor (for example pressure sensor), for an integrated pressure display, or for self-resetting fuses.

In this way, for example, no additional costs are incurred for overvoltage protection. Furthermore, the overvoltage protection may be provided without, for example, influencing or modifying the first electrode structure 104 on the substrate, as is illustrated for example in FIGS. 4A to 4C. The integrated overvoltage protection may, for example, increase reliability in the event of voltage spikes. Furthermore, the geometry of the varistor layer structure 110 may be provided in such a way that the threshold voltage of the varistor layer structure 110 is defined within certain limits (for example, a thickness of the varistor layer structure 110 may define the threshold voltage).

FIG. 4A, FIG. 4B and FIG. 4C respectively illustrate an optoelectronic component 100 in a schematic cross-sectional view, according to various embodiments, it being possible for the optoelectronic component 100 to include at least the following: a carrier 102, two electrode structures 104, 108, an optically functional layer structure 106 between the two electrode structures 104, 108, and a varistor layer structure 110 in physical contact with the two electrode structures 104, 108, in a similar way to that described above. In these configurations, the varistor layer structure 110 is configured as an encapsulation layer 210 (cf. FIG. 4A) or as part of the encapsulation layer 210 (cf. FIGS. 4B and 4C).

According to various embodiments, the carrier 102 (also referred to as a substrate, as for example described above) may include glass or consist of glass. Furthermore, any other suitable carrier 102 may be used for the optoelectronic component 100. A protective glass 402 (also referred to as a cover, as for example described above), which may for example be fastened by means of an adhesive layer 412 (also referred to as a connecting layer, as for example described above), may be arranged on or over the varistor layer structure 110, or the encapsulation layer 210.

According to various embodiments, the first electrode structure 104 may be transparent, or have at least one transparent region 104t. Furthermore, a functional output layer 422 may be arranged (for example optionally) on the side of the carrier 102 that faces away from the optically functional layer structure 106.

According to various embodiments, the first electrode structure 104 may include a first electrical contact feed 404z and a first contacting structure 404k, so that for example the transparent region 104t of the first electrode structure 104 is electrically contacted in a first electrical contact region, as is described above. According to various embodiments, the second electrode structure 108 may include a second electrical contact feed 408z and a second contacting structure 408k, so that the second electrode structure 108 is for example electrically contacted in a second electrical contact region, as is described above.

In this case, the contact feeds 404z, 408z may be configured according to the functionality of the optoelectronic component 100, and may for example be transparent or nontransparent. For example, one of the contact feeds 404z, 408z or both contact feeds 404z, 408z may include a metal or a metal alloy and be configured as a single layer or as a layer stack, for example including: Mo/Al (Mo, Cr/Al/Cr, Ag/Mg, Al). Furthermore, the contacting structures 404k, 408k may be configured according to the functionality of the optoelectronic component 100, and may for example be configured as a contacting layer or contacting film (for example ACF film, also referred to as anisotropically conductive layer).

Clearly, the first electrode structure 104 and the second electrode structure 108 may be configured in different ways, as is illustrated here by way of example, with the varistor layer structure 110 contacting both electrode structures 104, 108. For example, the varistor layer structure 110 may directly contact the second electrode 108 in the region above the optically functional layer structure 106. Furthermore, the varistor layer structure 110 may contact the first electrode 104 in the region of the first contact feed 404z and/or of the first contacting structure 404k. Furthermore, the varistor layer structure 110 may also contact the second electrode structure 108 in the region of the second contact feed 408z and/or of the second contacting structure 408k. Furthermore, the varistor layer structure 110 may directly contact the first electrode 104 in the e.g. transparent region 104t below the optically functional layer structure 106.

According to various embodiments, the first electrode structure 104 and the second electrode structure 108 may be electrically and physically separated from one another by means of an insulator layer 430 or by means of a plurality of insulator layers 430. A polyimide, or any other suitable resist, may be used for this.

The optically functional layer structure 106 may include at least one layer having organic (optically and/or electrically functional) material, as is described above.

As is illustrated in FIG. 4A in a schematic cross-sectional view, the optoelectronic component 100 may include just one encapsulation layer 110, 210 which simultaneously functions as a varistor layer structure 110, for example by means of the use of SiC, as is described above.

In a similar way, the encapsulation layer 210 of the optoelectronic component 100 may include a plurality of layers, i.e. it may be configured as an encapsulation layer stack, so that for example a plurality of functionalities may be ensured, as is described above. As is illustrated in FIG. 4B in a schematic cross-sectional view, the encapsulation layer 210 may include a varistor layer structure 110, which for example contacts the second electrode structure 108 in the region above the optically functional layer structure 106. Furthermore, the encapsulation layer 210 may include a heat conduction layer 410, for example in direct contact with the varistor layer structure 110. The heat conduction layer 410 may be arranged on the varistor layer structure 110. The heat conduction layer 410 may for example include aluminum nitride or consist of aluminum nitride, and of any other suitable material having a correspondingly high thermal conductivity. The heat conduction layer 410 may for example include a metal, for example copper or aluminum, as well as a metal alloy, for example Al/Cu.

According to various embodiments, the varistor layer structure 110 and/or the heat conduction layer 410 may be laterally structured. Furthermore, layer systems may also be used, for example nanolaminates.

In a similar way, the encapsulation layer 210 of the optoelectronic component 100 may include a plurality of layers, i.e. may be configured as an encapsulation layer stack, so that for example a plurality of functionalities may be ensured, as is described above. As is illustrated in FIG. 4C in a schematic cross-sectional view, the encapsulation layer 210 may include a varistor layer structure 110, which for example contacts the second electrode structure 108 in the region above the optically functional layer structure 106. Furthermore, the encapsulation layer 210 may include one or more further layers 440, 450, which for example are arranged at least on or over the varistor layer structure 110. For example, a first additional barrier layer 440 may be used, which may for example include silicon nitride (SiN), silicon oxide ($SiO_x$), silicon oxynitride ($SiNO_x$), silicon oxycarbonitride ($SiCNO_x$), for example also as a layer stack. For example, a second additional barrier layer 450 may be used, which may for example include aluminum oxide ($AlO_x$), titanium oxide ($TiO_x$) and/or antimony tin oxide (ATO), for example also as a layer stack.

In a similar way to that described above, the varistor layer structure 110 may also contact the second electrode structure 104 only laterally with respect to the optically functional layer structure 106.

Various modifications and configurations of the optoelectronic component 100 and details about the optically functional layer structure 106 and the varistor layer structure 110 will be described below, the basic features and functionalities described above being similarly includable. Furthermore, the features and functionalities described below may be applied similarly to the optoelectronic component 100 described in FIG. 3, or combined with the optoelectronic component 100 described in FIG. 3.

According to various embodiments, an optoelectronic component 100 is provided, which includes a hybrid integration of transparent nonconductive ZnO layers. In other words, a layer structure that functions both as electrode structure 104 and as a varistor layer structure 110 is provided on a substrate 102 (also referred to as a carrier). For example, ZnO may function during normal operation as an insulator between the anode and the cathode (i.e. for example in the absence of voltage spikes), and as a varistor in the event of an overvoltage (for example if voltage spikes occur). In this case, the varistor layer structure 110 of ZnO and a transparent electrical contact 104 may be provided in a plane.

Clearly, a varistor layer structure 110 may be arranged at least partially between the second electrode structure 108 and the carrier 102, or between the organic optically functional layer structure 106 and the carrier 102. Clearly, a varistor layer structure 110 may be provided next to a transparent region 104t of a first electrode structure 104. According to various embodiments, for example, a transparent region 104t of a first electrode structure 104 and the varistor layer structure 110 may be provided in a common layer structure. In this case, AZO (ZnO:Al) may be used as a transparent electrical contact 104, and ZnO may be used as an inorganic insulator/varistor.

According to various embodiments, the ZnO may be arranged as a varistor between the anode and the cathode and short-circuit the two of them when an overvoltage occurs. The ZnO therefore protects the two electrodes of an optoelectronic component 100. In this way, for example, no additional costs are incurred compared with substrates (or OLEDs) having AZO contacts when using pure $ZnO_x$.

Furthermore, at least one of the following materials may be used as a varistor material (also in combination): $ZnO_x$, $BiO_x$, $CrO_x$, $MnO_x$, $SbO_x$, $CoO_x$ and/or $SnO_x$, for example with a main proportion of $ZnO_x$.

According to various embodiments, an optoelectronic component 100 is provided, which has a reduced likelihood of failure at the insulator/transparent contact/metal transition, for example because of better layer reshaping and/or by avoiding sharp edges, which would otherwise cause a discontinuity in the layer. Furthermore, the integrated overvoltage protection increases the reliability in the event of voltage spikes.

By means of the hybrid integration, the ZnO functioning as a varistor is jointly encapsulated in the optoelectronic component 100, and is therefore protected against moisture.

According to various embodiments, an optoelectronic component 100 may include a carrier 102, as well as $ZnO_x$ structures, or mixed structures, arranged laterally next to one another on the carrier, these structures being provided (for example being undoped, for example being essentially free of aluminum) in such a way that they can act as varistors (i.e. structures having a voltage-dependent electrical resistance). At the same time, the $ZnO_x$ is doped with aluminum (e.g. in sections), so that a conductive transparent contact can be provided.

According to various embodiments, an optoelectronic component 100 may include a carrier 102, and includes a $ZnO_x$ layer arranged on the carrier, the $ZnO_x$ layer being doped with aluminum in a first region 104t, in such a way that the first region 104t is transparent and electrically conductive, and the $ZnO_x$ layer being provided in a second region 110 (for example being undoped, or for example being essentially free of aluminum) in such a way that the second region 110 can function as a varistor.

Figure 5A:
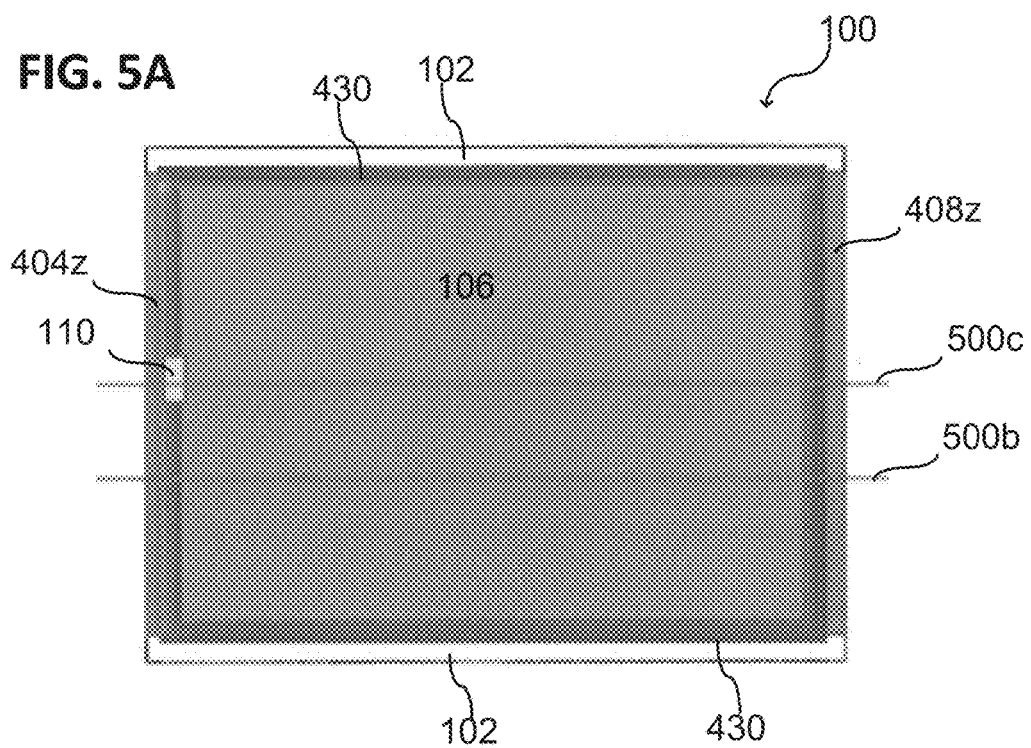
FIG. 5A shows an optoelectronic component in a schematic plan view, according to various embodiments.
Figure 5B:
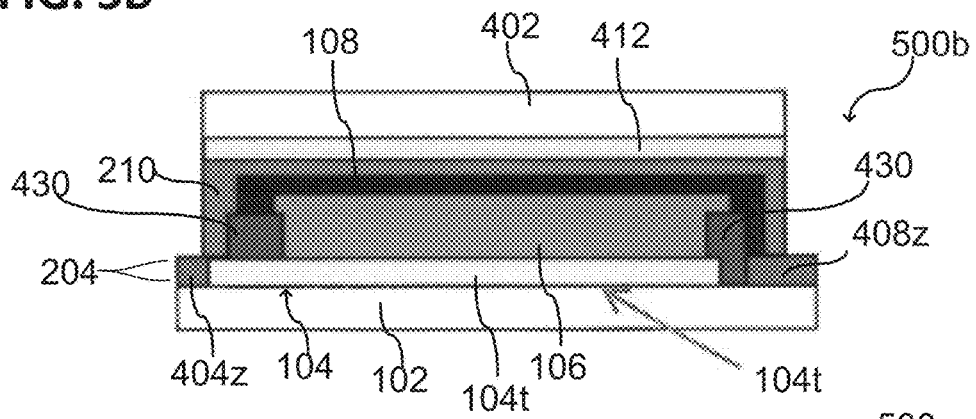
FIGS. 5B and 5C respectively show an optoelectronic component in a schematic cross-sectional view, according to various embodiments.
Figure 5C:
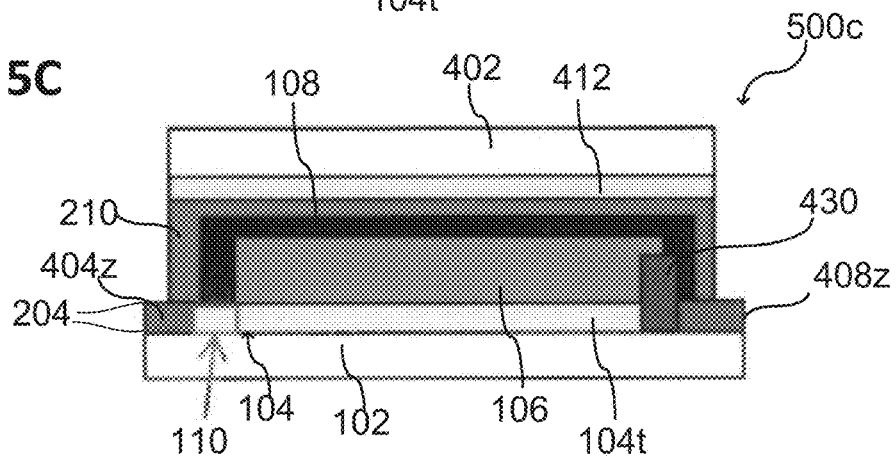

FIG. 5A illustrates an optoelectronic component 100 in a schematic plan view, and FIG. 5B and FIG. 5C respectively illustrate cross sections 500b, 500c of the optoelectronic component 100 represented in FIG. 5A, according to various embodiments, it being possible for the optoelectronic component 100 to include at least the following: a carrier 102, two electrode structures 104, 108, an optically functional layer structure 106 between the two electrode structures 104, 108, and a varistor layer structure 110 in physical contact with the two electrode structures 104, 108, in a similar way to that described above. In these configurations, the varistor layer structure 110 is arranged at least partially between the second electrode structure 108 and the carrier 102, or between the organic optically functional layer structure 106 and the carrier 102.

According to various embodiments, the optoelectronic component 100 may be encapsulated by means of an encapsulation layer 210, the latter being free of varistor material. Clearly, in this case, the varistor layer structure 110 may be integrated into the first electrode structure 104.

According to various embodiments, the carrier 102 (also referred to as a substrate, as for example described above) may include glass or consist of glass. Furthermore, any other suitable carrier 102 may be used for the optoelectronic component 100. A protective glass 402 (also referred to as a cover, as for example described above), which may for example be fastened by means of an adhesive layer 412 (also referred to as a connecting layer, as for example described above), may be arranged on or over the encapsulation layer 210.

According to various embodiments, the first electrode structure 104 may be transparent, or have at least one transparent region 104t. Furthermore, a functional output layer 422 may be arranged (for example optionally) on the side of the carrier 102 that faces away from the optically functional layer structure 106, as is described above.

According to various embodiments, the first electrode structure 104 may include a first electrical contact feed 404z (and a first contacting structure 404k, which is not represented, cf. FIG. 4A), so that for example the transparent region 104t of the first electrode structure 104 is electrically contacted in a first electrical contact region, as is described above. According to various embodiments, the second electrode structure 108 may include a second electrical contact feed 408z (and a second contacting structure 408k, which is not represented, cf. FIG. 4A), so that the second electrode structure 108 is for example electrically contacted in a second electrical contact region, as is described above.

In this case, the contact feeds 404z, 408z may be configured according to the functionality of the optoelectronic component 100, and may for example be transparent or nontransparent. For example, one of the contact feeds 404z, 408z or both of the contact feeds 404z, 408z may include a metal or a metal alloy and be configured as a single layer or as a layer stack, for example including: Mo/Al (Mo, Cr/Al/Cr, Ag/Mg, Al).

According to various embodiments, the varistor layer structure 110 (also referred to as a varistor region 110) may be integrated into the first electrode structure 104, for example be arranged between a transparent region 104t and the first contact feeds 404z of the first electrode structure 104. Clearly, the two electrode structure 104, 108 of the optoelectronic component 100 may be insulated from one another at least in sections by means of the varistor layer structure 110 during normal operation. The rest of the insulation may be carried out by means of an insulator layer 430 (for example by means of a polyimide or a resist), as is described here.

Clearly, the first electrode structure 104 and the second electrode structure 108 may be configured in different ways, as is illustrated here by way of example, with the varistor layer structure 110 contacting both electrode structures 104, 108. For example, the varistor layer structure 110 may directly contact the second electrode 108 from below. Furthermore, the varistor layer structure 110 may contact the first electrode 104 (or the transparent region 104t of the first electrode structure 104) laterally.

The optically functional layer structure 106 may include at least one layer having organic (optically and/or electrically functional) material, as is described above.

As is described above, the encapsulation layer 210 of the optoelectronic component 100 may for example include a plurality of layers, i.e. it may be configured as an encapsulation layer stack, so that for example a plurality of functionalities may be ensured, as is described above. For example, the encapsulation layer 210 may include a barrier layer and a heat conduction layer, in a similar way to that described above. For example, the encapsulation layer 210 may include a barrier layer which for example includes silicon nitride (SiN), silicon oxide ($SiO_x$), silicon oxynitride ($SiNO_x$), silicon oxycarbonitride ($SiCNO_x$), for example also as a layer stack. For example, the encapsulation layer 210 may include a barrier layer, which includes for example aluminum oxide ($AlO_x$), titanium oxide ($TiO_x$) and/or antimony tin oxide (ATO), for example also as a layer stack.

In a similar way to the optoelectronic component 100 represented in FIGS. 5A to 5C, FIGS. 6A to 6C represent an optoelectronic component 100 in which the two electrode structures 104, 108 are electrically insulated from one another exclusively by means of the varistor material (or by means of the varistor layer structure 110) during normal operation. Clearly, the construction of the optoelectronic component 100 may therefore be carried out without polyimide 430 or resist 430.

FIG. 6A illustrates an optoelectronic component 100 in a schematic plan view, according to various embodiments, with the optically transparent region 104t of the first electrode structure 104, or the first electrode structure 104 itself, being separated from the second electrode structure 108 only by means of the varistor layer structure 110. As is represented in FIG. 6B in a schematic cross-sectional view, the transparent region 104t of the first electrode structure 104 (or the first electrode structure 104 itself) may be laterally delimited all around by the varistor layer structure 110. In the case of a voltage spike, for example, the two contact feeds 404z, 408z and the two electrodes 104t, 108 are electrically conductively connected to one another.

Figure 6C:
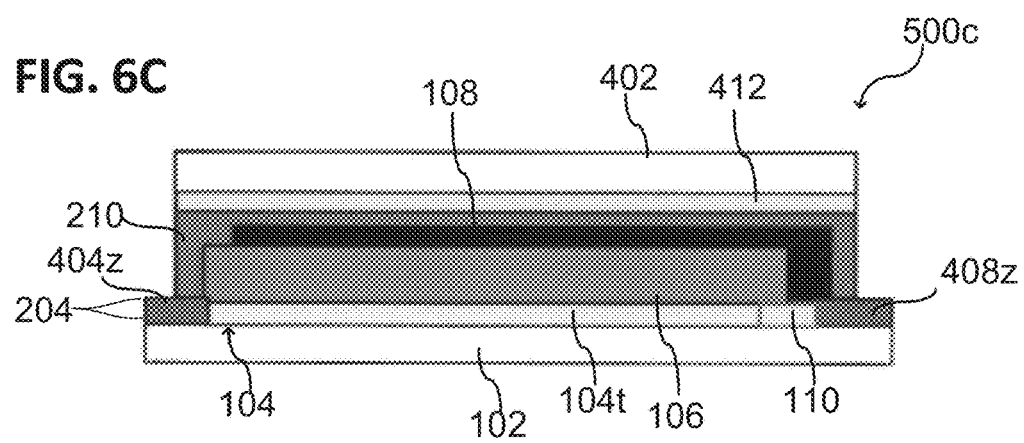

As is represented in FIG. 6C in a schematic cross-sectional view, the transparent region 104t of the first electrode structure 104 (or the first electrode structure 104 itself) may be separated from the second electrode structure 104 by means of the varistor layer structure 110. In the event of a voltage spike, for example, the second contact feed 408z and the transparent region 104t of the first electrode structure 104 are electrically conductively connected to one another, as are the second electrode structure 108 and the transparent region 104t of the first electrode structure 104. In contrast to the optoelectronic component 100 represented in FIG. 6B, the second electrode structure 104 is not physically connected directly to the first contact feed 404z of the first electrode structure 104.

During standard operation, the electrical current is therefore conducted through the organics 106 of the OLED 100 since the varistor 110 presents a very high electrical resistance so that the OLED 100 can shine. In the case of overvoltage (for example if voltage spikes occur or in the case of an ESD event), the electrical current is dissipated via the electrodes 104, 108 since the varistor 110 presents a very low electrical resistance, so that the OLED 100 does not shine. The adjustment of the switching point of the varistor may be carried out by means of the layer thickness and the area of the zinc oxide.

FIG. 7 illustrates a schematic flowchart for a method 700 for producing an optoelectronic component 100, it being possible for the method 700 to include the following: in 710, formation of a first layer structure 204 on a carrier, the first layer structure 204 including an optically transparent electrically conductive first electrode region 104t and a varistor region 110, the varistor region 110 adjoining (for example directly) the optically transparent electrically conductive electrode region 104t; in 720, formation of an organic optically functional layer structure 106, which is arranged at least partially over the optically transparent electrically conductive electrode region 104t; and, in 730, formation of an electrode structure 108 (for example a second electrode) which is arranged at least partially over the organic optically functional layer structure 106, the first electrode region 104t and the electrode structure 108 electrically contacting the organic optically functional layer structure 106, the electrode structure 108 furthermore contacting the varistor region 110. According to various embodiments, the optically transparent electrically conductive first electrode region 104t may be part of the first electrode structure 104, as described above.

FIG. 8A illustrates a carrier 102 (for example a substrate 102 of the optoelectronic component 100, as is described here, during production, for example during the method 700 for producing an optoelectronic component 100, according to various embodiments. In a first process step 800a, the carrier 102 is coated with a zinc oxide layer 804. This may, for example, be carried out by means of sputtering (so-called sputter deposition) or by means of sintering, etc. In a second process step 800b the zinc oxide layer 804 is doped with aluminum in sections, and for example the zinc oxide layer 804 may be covered in sections by means of a mask structure 880 (for example a varnish mask, etc.), while the aluminum can diffuse or be implanted into the uncovered regions of the zinc oxide layer 804, so that aluminum-doped zinc oxide (AZO) is formed there. The doping may, for example, be carried out by means of thermal diffusion or by means of ion implantation.

As an alternative thereto, as is schematically illustrated in FIG. 9, the varistor layer structure 110 may also initially be formed in a structured way on the carrier 102 in a first process step 900a, after which at least a part (for example the optically transparent electrically conductive first electrode region 104t) of the first electrode structure 104 is then formed in a second process step 900b.

As an alternative, an aluminum-doped zinc oxide layer may also be formed initially on the carrier 102, this then being partially removed again (for example by means of a laser or by means of etching) so that the varistor regions thereby provided between the remaining aluminum-doped zinc oxide can be filled with varistor material.

According to various embodiments, a method for substrate fabrication at different process times is respectively illustrated in FIGS. 8 and 9, according to various embodiments. The substrate 102 thereby produced may for example be the carrier 102 in the optoelectronic component 100, the first electrode structure 104 and the varistor layer structure 110 already being present on the carrier 102.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCES

100 optoelectronic component
102 carrier
104 first electrode structure
104t first region
106 organic optically functional layer structure
108 second electrode structure
110 second region
204 metal oxide layer
210 encapsulation layer
402 protective glass
404k first contacting structure
404z first electrical contact feed
408k second contacting structure
408z second electrical contact feed
410 heat conduction layer
412 adhesive layer
422 functional output layer
430 insulator layer
440, 450 further layers
500b, 500c cross sections
700, 710, 720, 730 method/method steps
800a, 900a first process step
804 zinc oxide layer
800b second process step
880 mask structure

The invention claimed is:
1. An optoelectronic component, comprising:
a carrier;
a zinc oxide layer, which is arranged on the carrier and has a first region and a second region,
wherein the first region is a first electrode structure which is doped with aluminum in such a way that the first region is transparent and electrically conductive, and wherein the zinc oxide layer has a lower doping of aluminum in the second region than in the first electrode structure;

an organic optically functional layer structure, which is arranged at least partially over the first electrode structure;

a second electrode structure, which is arranged at least partially over the organic optically functional layer structure, the first electrode structure and the second electrode structure electrically contacting the organic optically functional layer structure; and wherein the zinc oxide layer is configured in the second region as a varistor layer structure, which is arranged between the first electrode structure and the second electrode structure and physically contacts the two electrode structures, and wherein the varistor layer structure laterally physically contacts and adjoins the optically transparent first region;

further comprising: a heat conduction layer which is in direct contact with the varistor layer structure; and wherein the zinc oxide is polycrystalline.

2. The optoelectronic component as claimed in claim 1, wherein the varistor layer structure is configured as an encapsulation layer, which is arranged at least partially over the second electrode structure and/or over the organic optically functional layer structure.

3. The optoelectronic component as claimed in claim 1, wherein the varistor layer structure is arranged at least partially between the second electrode structure and the carrier, or between the organic optically functional layer structure and the carrier.

4. The optoelectronic component as claimed in claim 1, wherein the varistor layer structure is essentially free from aluminum doping.

* * * * *